United States Patent
Zhang et al.

(10) Patent No.: US 12,405,642 B2
(45) Date of Patent: Sep. 2, 2025

(54) FIXING ASSEMBLY AND ELECTRONIC DEVICE HAVING THE SAME

(71) Applicant: ASUSTeK COMPUTER INC., Taipei (TW)

(72) Inventors: Kunsu Zhang, Taipei (TW); Wen-Ting Yu, Taipei (TW); Zhaowei Sheng, Taipei (TW); Feng Huang, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 205 days.

(21) Appl. No.: 18/454,078

(22) Filed: Aug. 23, 2023

(65) Prior Publication Data

US 2024/0402770 A1  Dec. 5, 2024

(30) Foreign Application Priority Data

May 30, 2023 (TW) .................................. 112120181

(51) Int. Cl.
*G06F 1/18* (2006.01)
*H05K 1/14* (2006.01)

(52) U.S. Cl.
CPC .............. *G06F 1/185* (2013.01); *H05K 1/141* (2013.01)

(58) Field of Classification Search
CPC ................................ G06F 1/185; H05K 1/141
See application file for complete search history.

(56) References Cited

U.S. PATENT DOCUMENTS

| | | | |
|---|---|---|---|
| 5,268,820 A | * | 12/1993 | Tseng ................. H01R 12/7029 439/74 |
| 7,134,896 B1 | * | 11/2006 | Chen .................... H05K 7/1404 439/326 |
| 2023/0232563 A1 | | 7/2023 | Li |

FOREIGN PATENT DOCUMENTS

| | | |
|---|---|---|
| CN | 201152955 | 11/2008 |
| CN | 112068644 | 12/2020 |
| CN | 115297606 | 11/2022 |

* cited by examiner

*Primary Examiner* — James Wu
(74) *Attorney, Agent, or Firm* — JCIPRNET

(57) ABSTRACT

A fixing assembly is suitable for being arranged on a circuit board and configured to fix an expansion card. The fixing assembly includes a body and a buckle structure. The buckle structure includes a pressing part, a buckle part, an elastic member, and a base. The pressing part is away from the circuit board. An end of the buckle part is connected to the pressing part and has an inclined surface and a blocking surface connected to each other. The blocking surface has a gap with the top surface. The elastic member is connected to another end of the buckle part. When a first end of the expansion card is connected to the connector, a second end of the expansion card slides along the inclined surface to the top surface and is fixed in the gap by being abutted by the blocking surface.

8 Claims, 10 Drawing Sheets

FIXING ASSEMBLY AND ELECTRONIC DEVICE HAVING THE SAME

CROSS-REFERENCE TO RELATED APPLICATION

This application claims the priority benefit of Taiwan application serial no. 112120181, filed on May 30, 2023. The entirety of the above-mentioned patent application is hereby incorporated by reference herein and made a part of this specification.

BACKGROUND

Technical Field

The disclosure relates to a fixing assembly, and in particular to a fixing assembly having a buckle structure and an electronic device including the fixing assembly.

Description of Related Art

With the advancement of technology, the performance of electronic devices is gradually improved, and the number of electronic components fixed or inserted on the circuit board is increasing. At present, the motherboard of most electronic devices is disposed with an M.2 connector to which an M.2 expansion card may be connected, so as to facilitate expansion for the convenience of users.

However, when installing the M.2 expansion card on the motherboard, usually the fixing method is too complicated, the mechanism design cost is high, and the motherboard takes up a lot of space. Therefore, how to dispose more components under the motherboard with limited space and facilitate the installation of M.2 expansion cards is the goal of research in this field.

SUMMARY

The disclosure provides a fixing assembly suitable for being arranged on a circuit board, and the circuit board has a connector configured to fix an expansion card. The fixing assembly includes a body and a buckle structure. The body includes a top surface and a bottom surface opposite to each other. The buckle structure includes a pressing part, a buckle part, an elastic member, and a base, and the buckle structure is adjacent to the body. The pressing part is away from the circuit board.

An end of the buckle part is connected to the pressing part and has an inclined surface and a blocking surface connected to each other, the blocking surface is parallel to the top surface and has a gap with the top surface, and the elastic member is connected to another end of the buckle part and extends toward the circuit board. The base contacts the circuit board and includes a first side and a second side opposite to each other, the first side faces the connector, and the second side is connected to the elastic member, in which the body is disposed between the first side and the second side. When a first end of the expansion card is connected to the connector, a second end of the expansion card slides along the inclined surface to the top surface and is fixed in the gap by being abutted by the blocking surface.

The disclosure provides an electronic device, including a circuit board and a fixing assembly.

Based on the above, the fixing assembly in the disclosure is suitable for being installed on the circuit board, and users can fix the expansion card on the circuit board through the fixing assembly. When fixing the expansion card, the function of automatic locking is realized through the elastic member and the buckle part, eliminating the need for screws or other manual fixing. When releasing the expansion card, just press the pressing part to make the expansion card pop out, which is fast and convenient.

DESCRIPTION OF THE EMBODIMENTS

Figure 1:
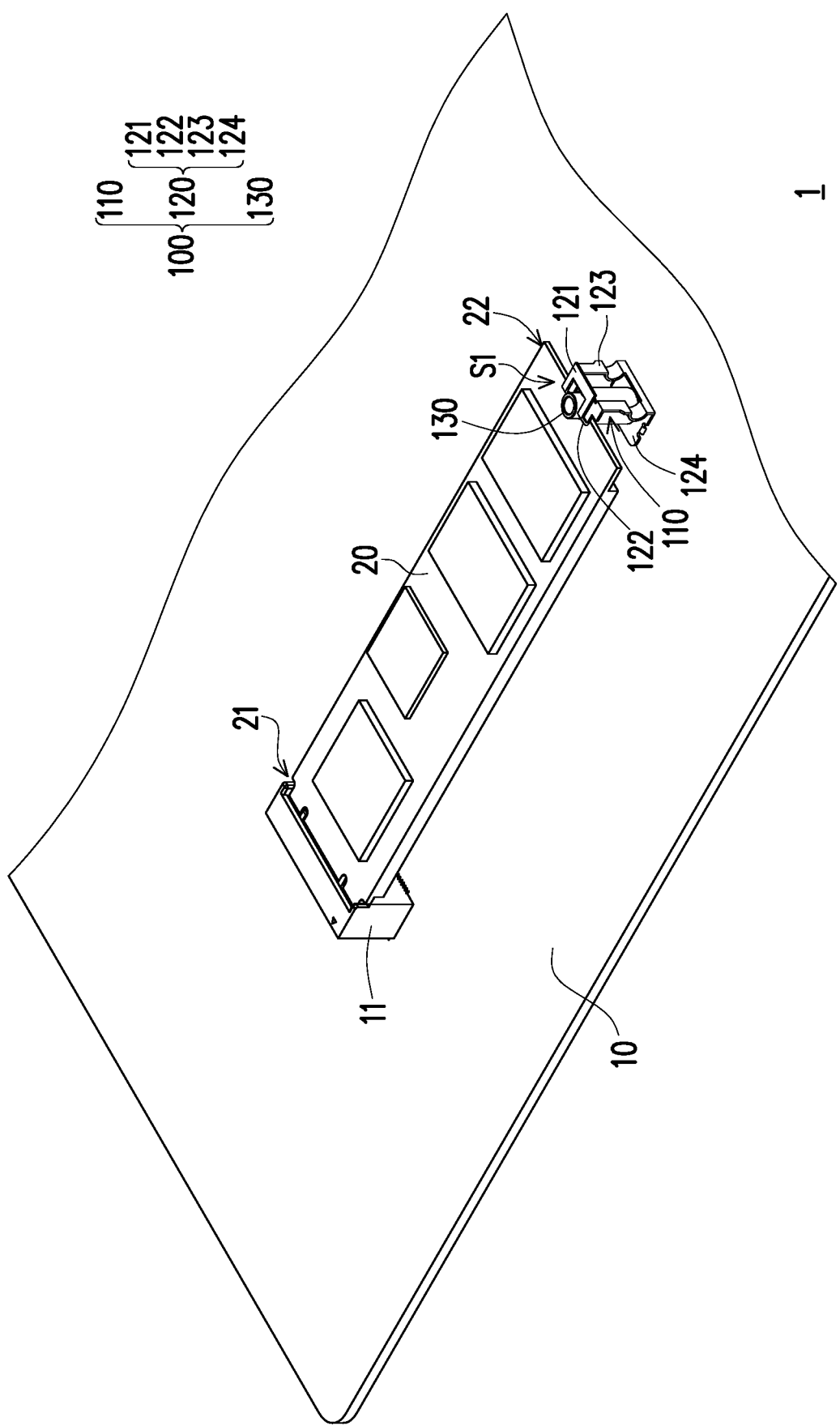
FIG. 1 is a schematic perspective view of an electronic device according to an embodiment of the disclosure.
Figure 2:
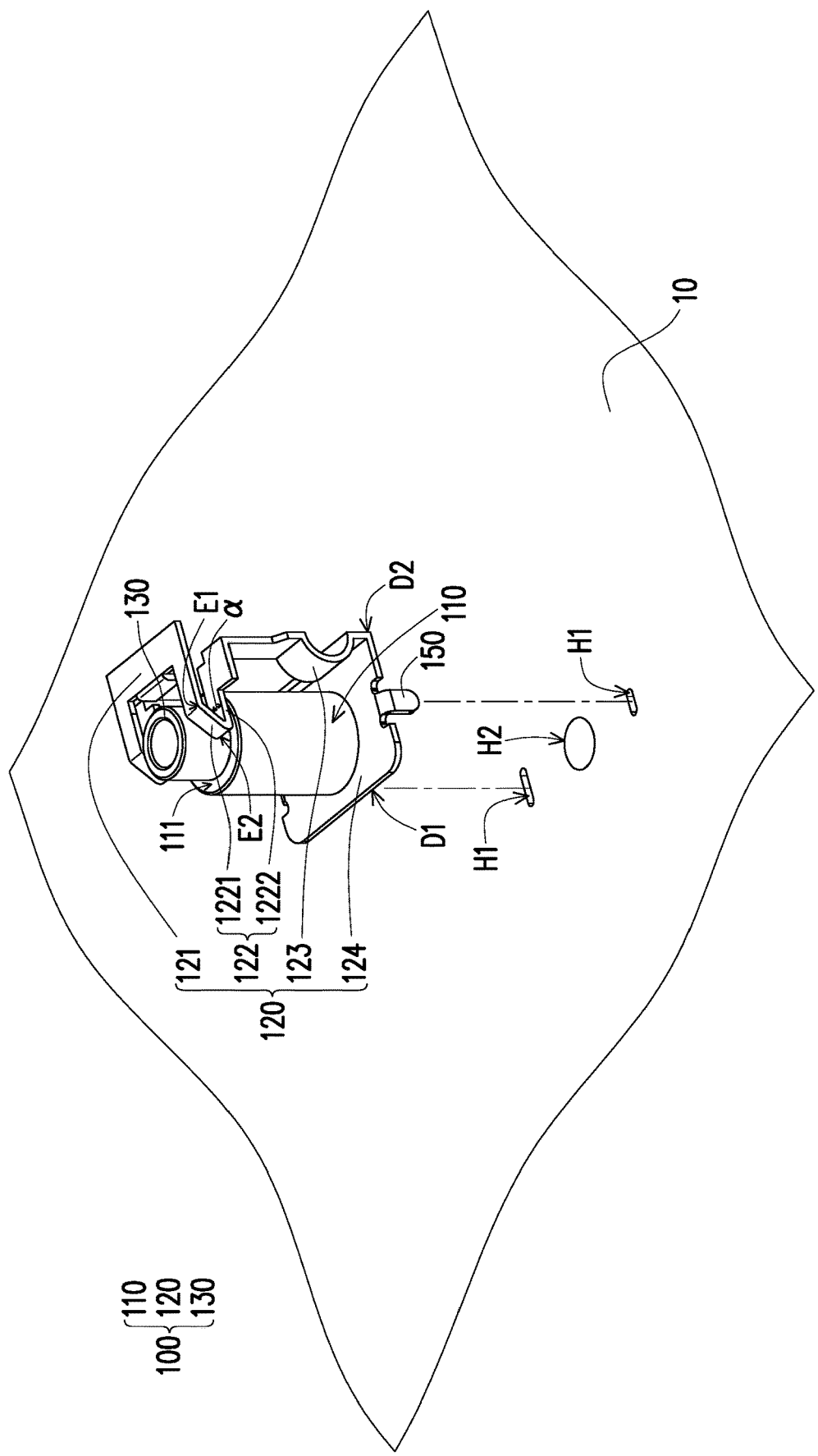
FIG. 2 is a disassembled schematic view of a fixing assembly and a circuit board in FIG. 1.

Please refer to FIG. 1 and FIG. 2. An electronic device 1 provided in the disclosure includes a circuit board 10 and a fixing assembly 100. In an embodiment, the circuit board 10 is, for example, a motherboard, but not limited thereto, and the circuit board 10 includes a connector 11. The connector 11 and the fixing assembly 100 are arranged on the circuit board 10. The fixing assembly 100 is suitable for fixing an expansion card 20.

In an embodiment, the expansion card 20 is, for example, a solid state drive (SSD) with an M.2 interface, but the type of the expansion card 20 is not limited thereto. The expansion card 20 is plugged into the connector 11 to be electrically connected to the circuit board 10.

In an embodiment, when the expansion card 20 is installed on the circuit board 10, a first end 21 of the expansion card 20 is connected to the connector 11 on the circuit board 10, and a second end 22 of the expansion card 20 is fixed by a buckle structure 120.

In an embodiment, the fixing assembly 100 includes a body 110 and the buckle structure 120. The buckle structure 120 is adjacent to the body 110. The buckle structure 120 includes a pressing part 121, a buckle part 122, an elastic member 123, and a base 124. The pressing part 121 is away from the circuit board 10. An end of the buckle part 122 is connected to the pressing part 121 and has an inclined surface 1221 and a blocking surface 1222 connected to each other. The blocking surface 1222 is parallel to a top surface 111 of the body 110 and has a gap with the top surface 111. The elastic member 123 is connected to another end of the buckle part 122 and extends toward the circuit board 10.

In this embodiment, the inclined surface 1221 and the blocking surface 1222 are positioned between the pressing part 121 and the elastic member 123, and the inclined surface 1221 is connected to the pressing part 121. The blocking surface 1222 is connected to an end of the elastic member 123, and another end of the elastic member 123 is connected to the body 110. That is to say, the elastic member 123 is connected to the body 110 through an end part away from the blocking surface 1222.

In an embodiment, the elastic member 123 is made of metal or plastic, and the body 110 and the buckle structure 120 are integrally formed, but the disclosure is not limited thereto. In the status shown in FIG. 3, the blocking surface 1222 and the pressing part 121 are parallel to the surface of the circuit board 10, but the disclosure is not limited thereto.

In an embodiment, the base 124 contacts the circuit board 10 and includes a first side D1 and a second side D2 opposite to each other, the first side D1 faces the connector 11, and the second side D2 is connected to the elastic member 123, in which the body 110 is disposed between the first side D1 and the second side D2.

In an embodiment, the inclined surface 1221 has a front end E1 and a distal end E2, and the distance between the front end E1 and the body 110 is greater than the distance between the distal end E2 and the body 110. The distal end E2 of the inclined surface 1221 is closer to the first side D1 than the front end E1. Specifically, an included angle α facing the second side D2 is between the inclined surface 1221 and the blocking surface 1222, and the included angle α is smaller than 90 degrees.

In an embodiment, the pressing part 121 protrudes from the second side D2 so as to be pressed by the user conveniently, but the disclosure is not limited thereto.

In an embodiment, the fixing assembly 100 further includes multiple welding feet 150, and the multiple welding feet 150 are inserted into a through hole H1 on the circuit board 10 to be welded with the circuit board 10 to achieve a fixing effect.

Figure 3:
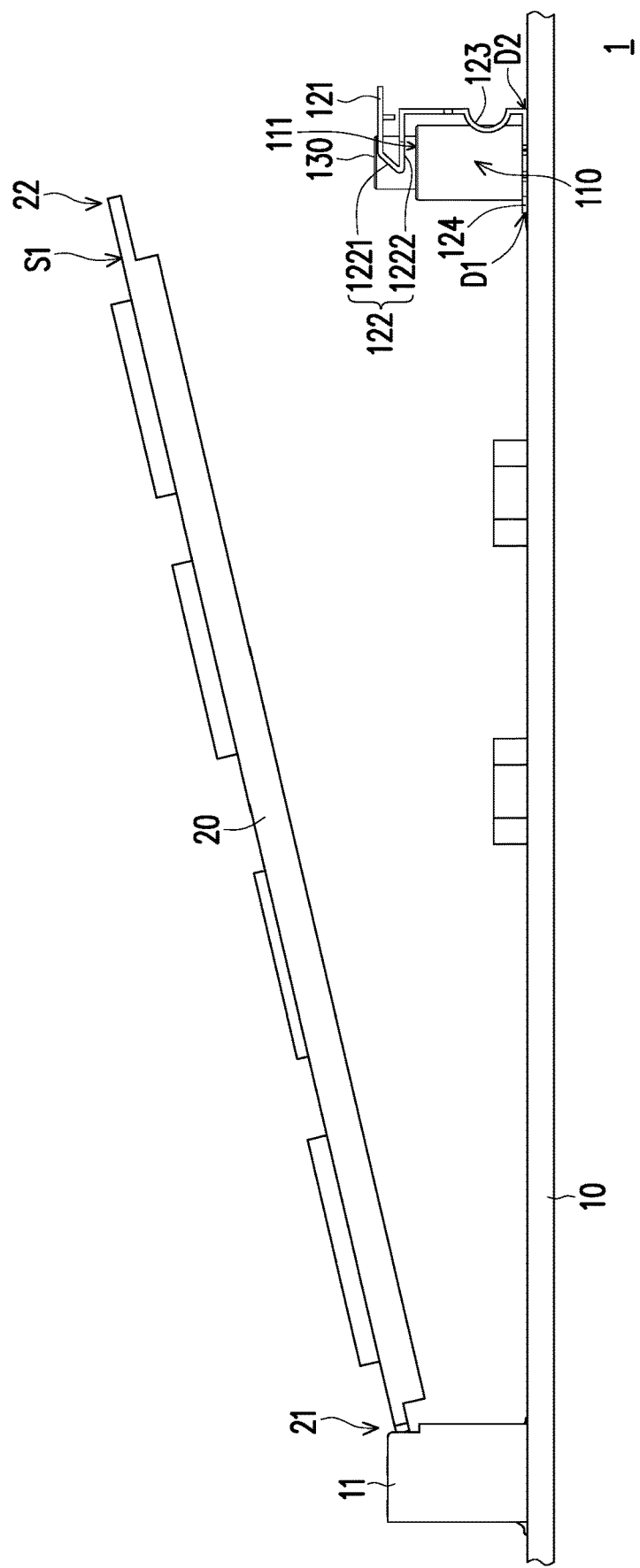
FIG. 3 to FIG. 7 are schematic views of the assembly process of an expansion card shown in FIG. 1.
Figure 4:
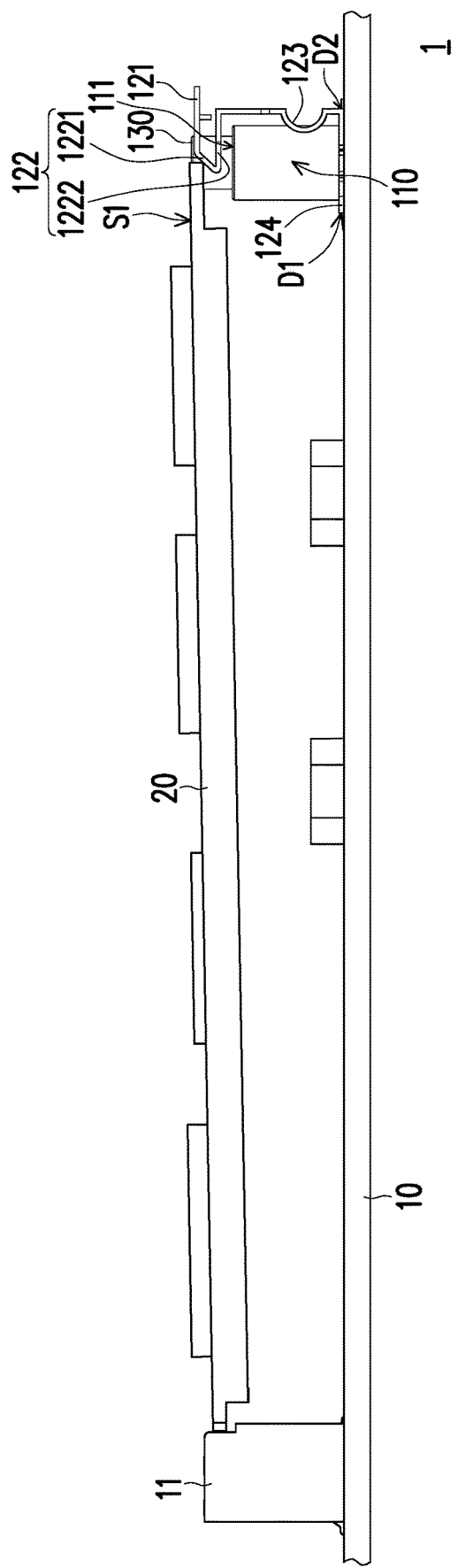
Figure 5:
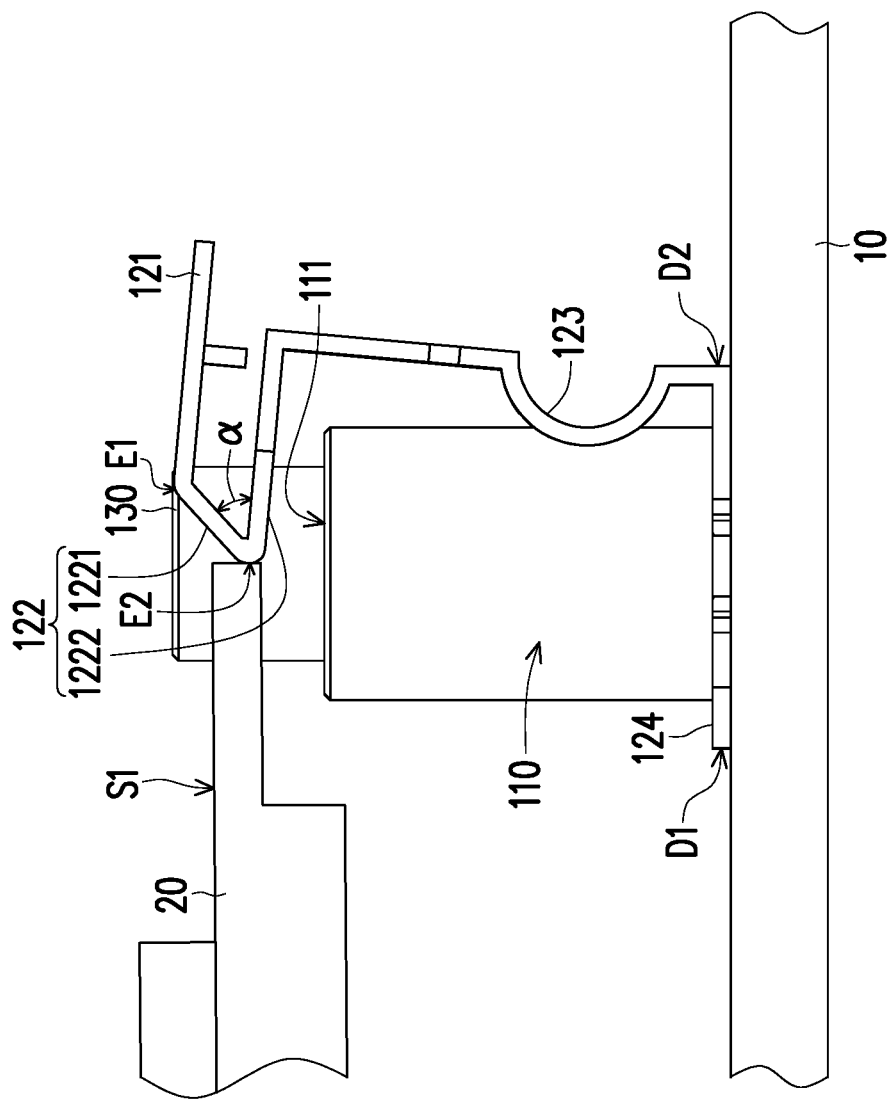

Please refer to FIG. 3 to FIG. 5. During a process of installing the expansion card 20 on the circuit board 10, the first end 21 of the expansion card 20 is first inserted into the connector 11 on the circuit board 10. Next, the second end 22 of the expansion card 20 contacts the inclined surface 1221 of the buckle part 122. Next, press down the expansion card 20, the second end 22 of the expansion card 20 slides along the inclined surface 1221 to get close to the circuit board 10, at the same time, the buckle part 122 is stressed and bent and deformed by the elastic member 123 to drive the buckle part 122 to move to the right until the second end 22 of the expansion card 20 leaves the distal end E2 of the inclined surface 1221.

Figure 6:
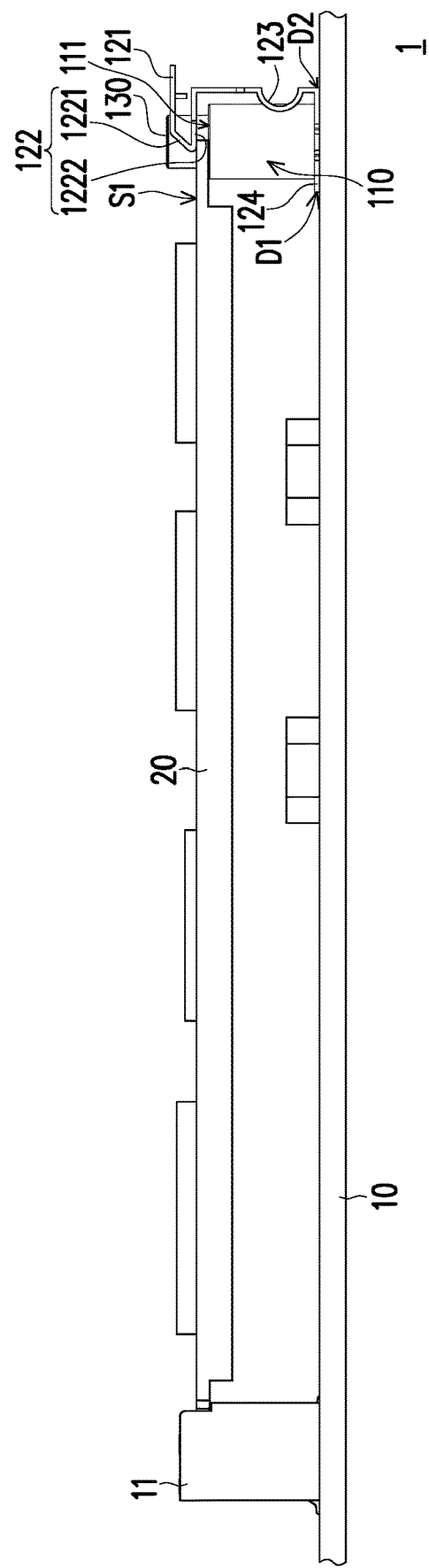

Please refer to FIG. 6. When the second end 22 of the expansion card 20 leaves the distal end E2 of the inclined surface 1221, the expansion card 20 contacts the top surface 111 of the body 110, the top surface 111 and the blocking surface 1222 are opposite to each other, and is fixed in the gap between the blocking surface 1222 and the top surface 111 by being abutted by the blocking surface 1222. Further, when the expansion card 20 is installed on the circuit board 10, the second end 22 of the expansion card 20 is sandwiched between the top surface 111 and the blocking surface 1222. At this time, the buckle part 122 is no longer pushed by the expansion card 20 and thus may be automatically restored by the elastic restoring force of the elastic member 123 so that the blocking surface 1222 abuts an upper surface S1 of the expansion card 20. In this way, the expansion card 20 may be locked by pressing down when the expansion card 20 is installed, which is fast and convenient.

Figure 7:
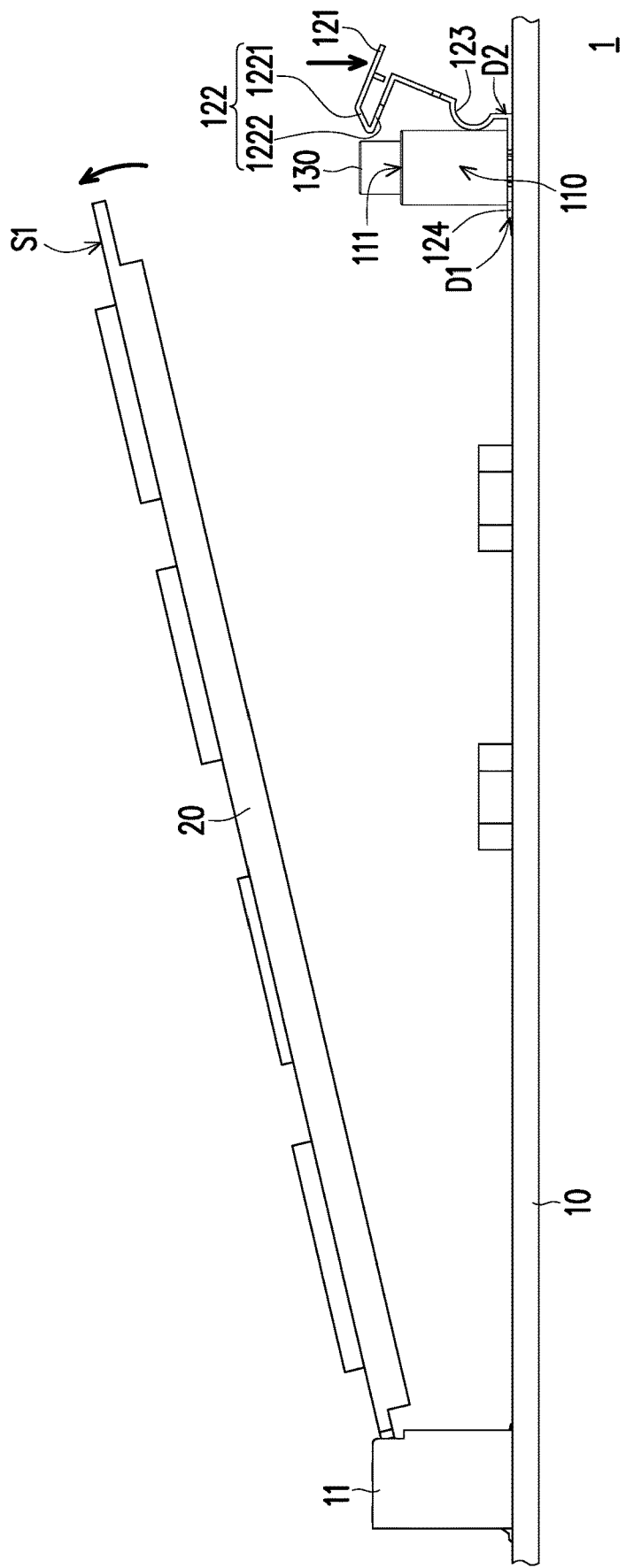

Please refer to FIG. 7. During the process of separating the expansion card 20 from the circuit board 10, as long as the pressing part 121 is pressed down, the pressing part 121 drives the elastic member 123 to deform, and then drives the blocking surface 1222 of the buckle part 122 to leave the expansion card 20, thus make the expansion card 20 pop out, and the expansion card 20 can be quickly released, which is convenient.

Figure 8:
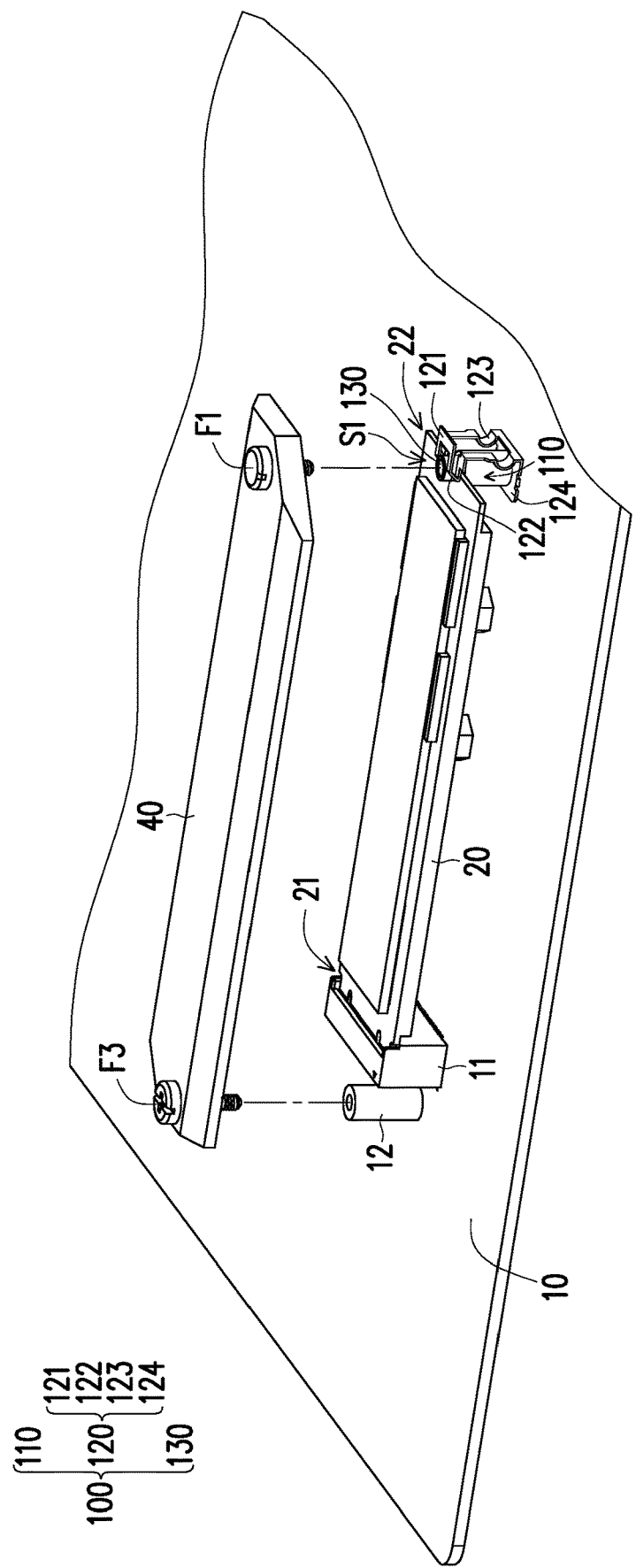
FIG. 8 is a schematic perspective view of an electronic device according to an embodiment of the disclosure.
Figure 9:
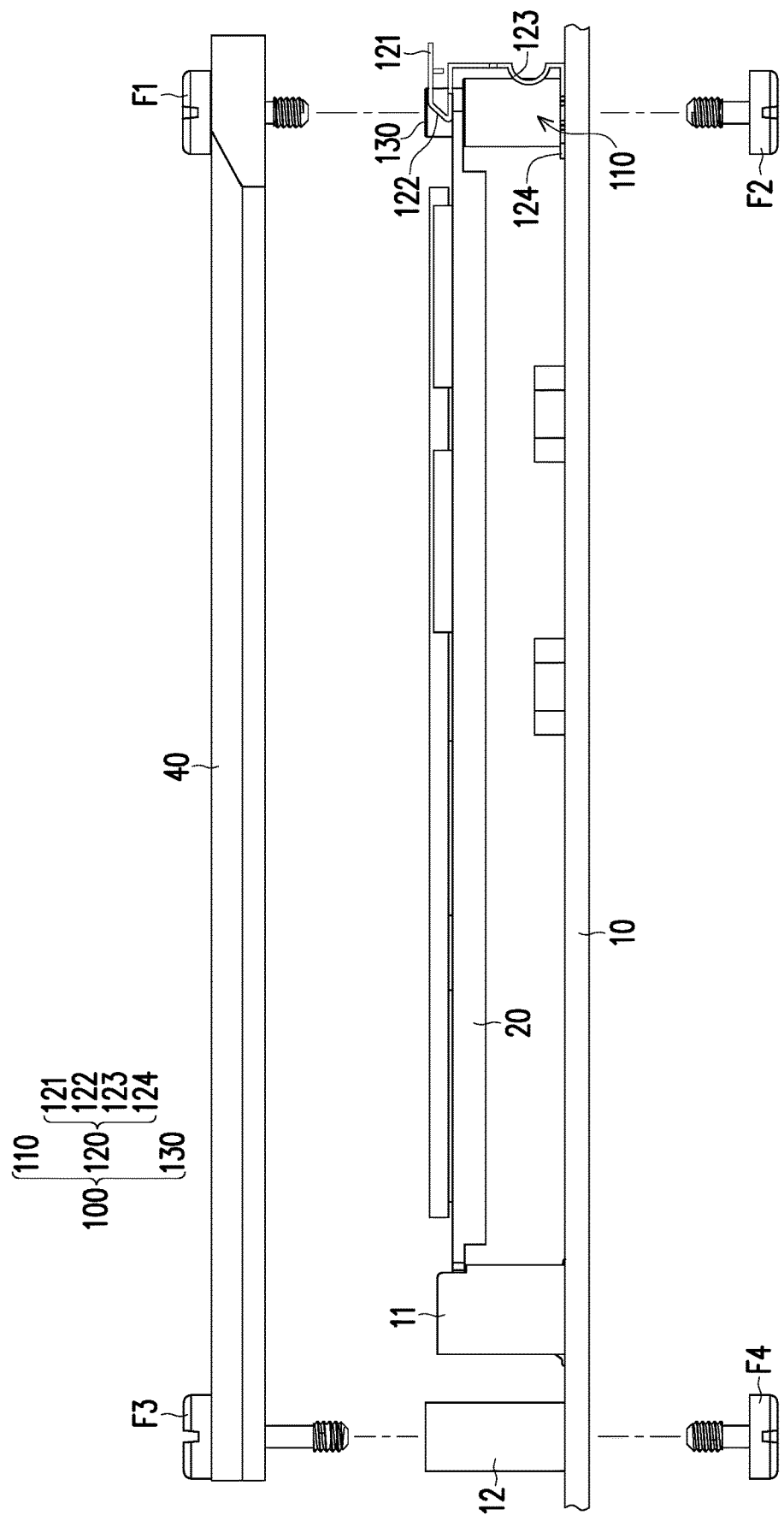
FIG. 9 is a disassembled side view of the electronic device in FIG. 8.
Figure 10:
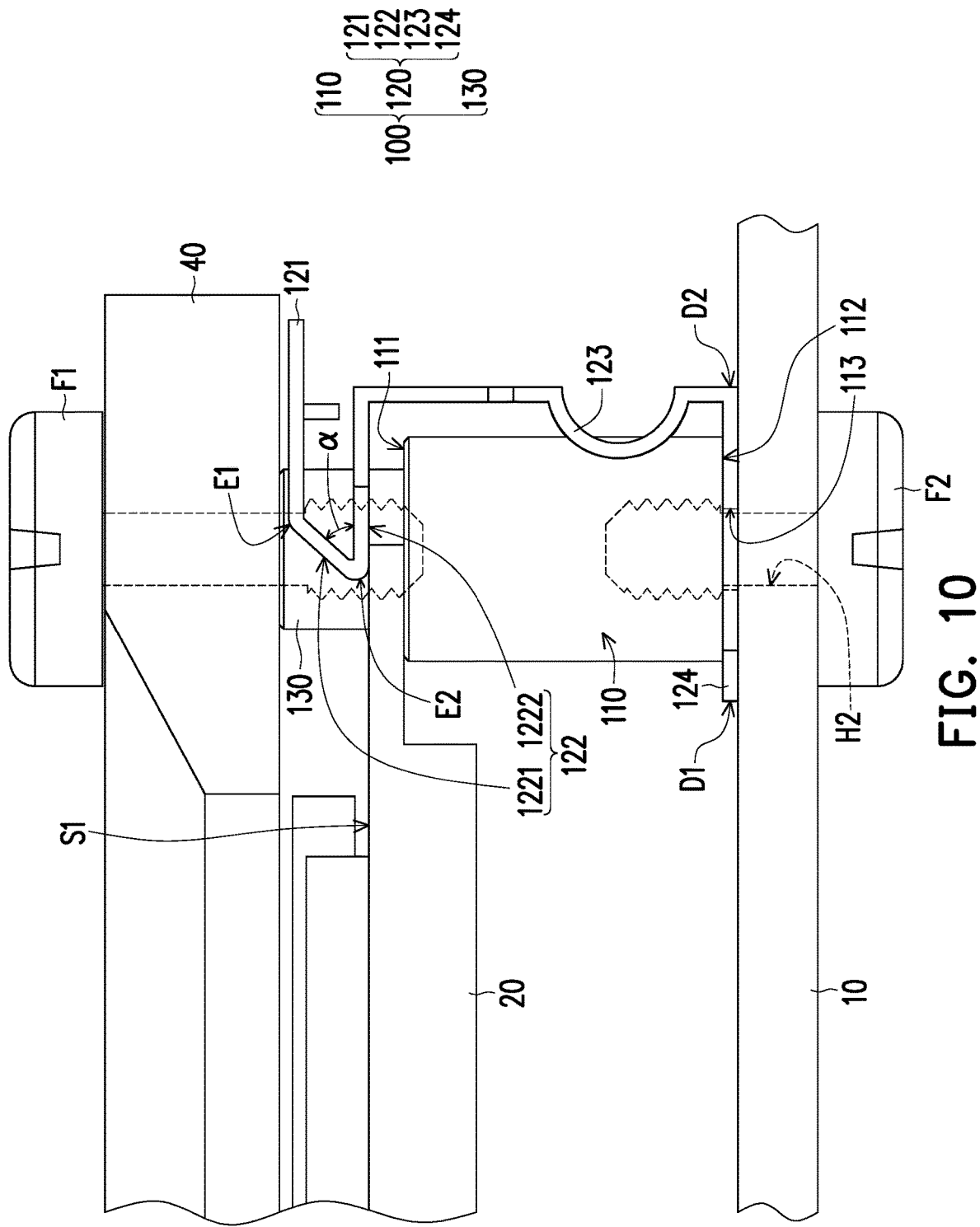
FIG. 10 is a partially enlarged schematic view of a heat sink in FIG. 8 after being assembled.

Please refer to FIG. 8 to FIG. 10. In an embodiment, the fixing assembly 100 includes a connection column 130 configured to connect a heat sink 40, and the heat sink 40 is detachably positioned above the expansion card 20. In this embodiment, the surface of the heat sink 40 is shown as a plane, but the disclosure is not limited thereto. Of course, in other embodiments, the heat sink 40 may also be fins or other shapes that help the expansion card 20 dissipate heat.

In an embodiment, the circuit board 10 further includes a locking part 12, and the locking part 12 includes a screw hole and is arranged on the circuit board 10. The connection column 130 is positioned on the top surface 111 of the body 110, and the connection column 130 includes screw holes, for example. An end of the heat sink 40 is locked to the connection column 130 through a locking member F1. Another end of the heat sink 40 is locked to the locking part 12 through a locking member F3. In this way, the fixing assembly 100 may also be used to fix the heat sink 40 to save the space of the circuit board 10. In an embodiment, the locking member F1 and the locking member F3 are, for example, screws, but not limited thereto.

Please refer to FIG. 10. In an embodiment, the circuit board 10 further includes a through hole H2, the body 110 has a bottom surface 112 opposite to the top surface 111, the bottom surface 112 has a screw hole 113, and a locking member F2 is provided to pass through the through hole H2 of the circuit board 10 and locked to the screw hole 113 of the body 110 to fix the fixing assembly 100 to the circuit board 10. In an embodiment, the locking member F2 is, for example, a screw, but not limited thereto. The advantage of this design is that the stability between the fixing assembly 100 and the circuit board 10 can be enhanced.

In summary, the fixing assembly in the disclosure is suitable for being installed on the circuit board, and users can fix the expansion card on the circuit board through the fixing assembly. When fixing the expansion card, the function of automatic locking is realized through the elastic member and the buckle part, eliminating the need for screws or other manual fixing. When releasing the expansion card, just press the pressing part to make the expansion card pop out, which is fast and convenient. In addition, the fixing assembly also includes a connection column, which may be used to connect the heat sink and save the space of the circuit board.

Although the disclosure has been disclosed as above with the embodiments, the embodiments are not used to limit the disclosure. Persons with common knowledge in the technical field may make some changes and modifications without departing from the spirit and scope of this case. Therefore, the protection of the scope of the disclosure shall be defined by the appended claims.

What is claimed is:

1. A fixing assembly suitable for being arranged on a circuit board, wherein the circuit board has a connector configured to fix an expansion card, and the fixing assembly comprises:
   a body, comprising a top surface and a bottom surface opposite to each other;
   a connection column positioned on the top surface, and the connection column is configured to connect a heat sink; and
   a buckle structure, adjacent to the body, comprising:
   a pressing part, away from the circuit board;
   a buckle part, wherein an end is connected to the pressing part and has an inclined surface and a blocking surface connected to each other, and the blocking surface is parallel to the top surface and has a gap with the top surface;
   an elastic member, connected to another end of the buckle part and extending toward the circuit board; and a base, contacting the circuit board and comprising a first side and a second side opposite to each other, the first side faces the connector, and the second side is connected to the elastic member, wherein the body is disposed between the first side and the second side; when a first end of the expansion card is connected to the connector, a second end of the expansion card slides along the inclined surface to the top surface and is fixed in the gap by being abutted by the blocking surface.

2. The fixing assembly according to claim 1, wherein the inclined surface has a front end and a distal end, and a distance between the front end and the body is greater than a distance between the distal end and the body.

3. The fixing assembly according to claim 2, wherein the distal end is closer to the first side than the front end.

4. The fixing assembly according to claim 1, wherein the pressing part protrudes from the second side.

5. The fixing assembly according to claim 1, wherein an included angle facing the second side is between the inclined surface and the blocking surface, and the included angle is smaller than 90 degrees.

6. The fixing assembly according to claim 1, wherein the bottom surface has a screw hole, and a locking member is provided to pass through the screw hole to fix the fixing assembly to the circuit board.

7. The fixing assembly according to claim 1, wherein the body and the buckle structure are integrally formed.

8. An electronic device, comprising:
a circuit board, having a connector; and
a fixing assembly, wherein the connector and the fixing assembly are arranged on the circuit board, suitable for installing an expansion card, the fixing assembly comprises:
a body, comprising a top surface and a bottom surface opposite to each other;
a connection column positioned on the top surface, and the connection column is configured to connect a heat sink; and
a buckle structure, adjacent to the body, comprising:
a pressing part, away from the circuit board;
a buckle part, wherein an end is connected to the pressing part and has an inclined surface and a blocking surface connected to each other, and the blocking surface is parallel to the top surface and has a gap with the top surface;
an elastic member, connected to another end of the buckle part and extending toward the circuit board; and
a base, contacting the circuit board and comprising a first side and a second side opposite to each other, the first side faces the connector, and the second side is connected to the elastic member, wherein the body is disposed between the first side and the second side,
when a first end of the expansion card is connected to the connector, a second end of the expansion card slides along the inclined surface to the top surface and is fixed in the gap by being abutted by the blocking surface.

* * * * *